United States Patent
Akagawa et al.

(10) Patent No.: US 10,403,687 B2
(45) Date of Patent: Sep. 3, 2019

(54) ELECTRO-OPTICAL DEVICE, METHOD FOR MANUFACTURING ELECTRO-OPTICAL DEVICE, AND ELECTRONIC APPARATUS

(71) Applicant: SEIKO EPSON CORPORATION, Tokyo (JP)

(72) Inventors: Suguru Akagawa, Matsumoto (JP); Ryoichi Nozawa, Tatsuno-machi (JP); Naotaka Kubota, Chino (JP); Takefumi Fukagawa, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 64 days.

(21) Appl. No.: 15/812,595

(22) Filed: Nov. 14, 2017

(65) Prior Publication Data

US 2018/0138245 A1 May 17, 2018

(30) Foreign Application Priority Data

Nov. 15, 2016 (JP) ................................ 2016-222729

(51) Int. Cl.
| | | |
|---|---|---|
| *H01L 27/32* | (2006.01) | |
| *H01L 51/52* | (2006.01) | |
| *G09G 3/3225* | (2016.01) | |
| *G09G 3/20* | (2006.01) | |

(52) U.S. Cl.
CPC ......... *H01L 27/322* (2013.01); *G09G 3/2003* (2013.01); *G09G 3/3225* (2013.01); *H01L 27/3244* (2013.01); *H01L 51/525* (2013.01); *H01L 51/5246* (2013.01); *H01L 51/5271* (2013.01)

(58) Field of Classification Search
CPC ......................... H01L 51/5246; H01L 51/525; H01L 51/5271
See application file for complete search history.

(56) References Cited

U.S. PATENT DOCUMENTS

| | | |
|---|---|---|
| 2006/0202613 A1 | 9/2006 | Kawaguchi et al. |
| 2008/0224968 A1 | 9/2008 | Kashiwabara |
| 2013/0187840 A1 | 7/2013 | Tomita et al. |
| 2014/0027725 A1* | 1/2014 | Lim ............. H01L 51/5284 257/40 |
| 2014/0117842 A1 | 5/2014 | Hanamura |
| 2015/0333108 A1 | 11/2015 | Miyamoto et al. |

FOREIGN PATENT DOCUMENTS

| | | |
|---|---|---|
| JP | 2001-093666 A | 4/2001 |
| JP | 2003-282259 A | 10/2003 |
| JP | 2004-039388 A | 2/2004 |

(Continued)

*Primary Examiner* — Joseph L Williams
*Assistant Examiner* — Jacob R Stern
(74) *Attorney, Agent, or Firm* — Oliff PLC

(57) ABSTRACT

There is provided an electro-optical device including a light-emitting element, a sealing layer that covers the light-emitting element, a color filter layer that is formed on the sealing layer, and a convex portion that is provided between the sealing layer and the color filter layer and has a first surface in contact with the sealing layer and a second surface in contact with the color filter layer, in which the second surface is a curved surface.

15 Claims, 7 Drawing Sheets

(56) References Cited

FOREIGN PATENT DOCUMENTS

| | | | |
|---|---|---|---|
| JP | 2008-225179 | A | 9/2008 |
| JP | 2012-209116 | A | 10/2012 |
| JP | 2013-175433 | A | 9/2013 |
| JP | 2013-258021 | A | 12/2013 |
| JP | 2014-089804 | A | 5/2014 |
| JP | 2015-069700 | A | 4/2015 |

* cited by examiner

ELECTRO-OPTICAL DEVICE, METHOD FOR MANUFACTURING ELECTRO-OPTICAL DEVICE, AND ELECTRONIC APPARATUS

BACKGROUND

1. Technical Field

The present invention relates to an electro-optical device, a method for manufacturing an electro-optical device, and an electronic apparatus.

2. Related Art

In an electro-optical device including a light-emitting element such as an organic electro luminescent (EL) element, in order to realize color display, a configuration is known in which a color filter that transmits light in a desired wavelength region is provided on a sealing layer that covers the light-emitting element. For example, JP-A-2013-175433 discloses a configuration in which color filters of three colors corresponding to red, green, and blue are provided on a sealing layer covering a light-emitting element.

By the way, in the process of forming a color filter, it is common to suppress the temperature of the process to a low temperature (for example, 110 degrees or less) in order to prevent deterioration of the light-emitting element due to heat. However, in a case where the color filter is formed at a low temperature, the bonding strength between the color filter and the sealing layer becomes weaker as compared with the case where the color filter is formed at a high temperature. Therefore, the color filter sometimes peels off from the sealing layer in a processing process or the like after forming the color filter.

SUMMARY

An advantage of some aspects of the invention is to provide a technique for reducing the possibility of peeling-off of the color filter from the sealing layer.

According to an aspect of the invention, there is provided an electro-optical device including a light-emitting element, a sealing layer that covers the light-emitting element, a color filter layer that is formed on the sealing layer, and a convex portion that is provided between the sealing layer and the color filter layer and has a first surface in contact with the sealing layer and a second surface in contact with the color filter layer, in which the second surface is a curved surface.

According to the aspect of the invention, the color filter layer is provided so as to be in contact with the sealing layer and a second surface of the convex portion in contact with the sealing layer. Therefore, the area of the portion in contact with the color filter layer may be increased, and the bonding strength between the color filter layer and the sealing layer may be increased compared to the case where the color filter layer is provided so as to be in contact with only the sealing layer. Thus, according to the aspect of the invention, it is possible to reduce the possibility that the color filter layer is peeled off from the sealing layer as compared with the case where the convex portion is not provided.

Furthermore, according to the aspect of the invention, the second surface of the convex portion is formed in a curved surface shape. Therefore, the adhesion between the color filter layer and the convex portion may be enhanced as compared with the case where the second surface of the convex portion is formed to have an angular portion. Thus, according to the aspect of the invention, the bonding strength between the color filter layer and the convex portion may be increased, and it is possible to reduce the possibility of peeling-off of the color filter layer from the sealing layer as compared with the case where the second surface of the convex portion is formed to have an angular portion.

In addition, an electro-optical device according to the aspect of the invention may include a light-emitting element, a sealing layer that covers the light-emitting element, a color filter layer that is formed on the sealing layer and has a first color filter and a second color filter, and a convex portion that is provided between the sealing layer and the color filter layer and has a first surface in contact with the sealing layer and a second surface in contact with the first color filter and the second color filter, in which the second surface may be a curved surface.

In the above-described electro-optical device, the shape of the second surface in the cross section including the color filter layer and the convex portion may be a substantially arc shape.

Thus, according to this aspect, the adhesion between the color filter layer and the convex portion may be enhanced, and it is possible to reduce the possibility of peeling-off of the color filter layer from the sealing layer as compared with the case where the second surface of the convex portion is formed to have an angular portion.

In the electro-optical device described above, the color filter layer may include the first color filter that transmits light in a first wavelength region and the second color filter that transmits light in a second wavelength region, and the top portion of the second surface farthest from the sealing layer may be covered with the first color filter and the second color filter.

According to this aspect, the first and second color filters are formed to overlap on the top portion of the convex portion. For this reason, it is possible to reduce the possibility that at least one of the first and second color filters is separated from the sealing layer as compared with the case where the first and second color filters are formed not to overlap on the top portion of the convex portion.

In the electro-optical device described above, the color filter layer may include the first color filter being in contact with the sealing layer and the convex portion, and in a cross section including the convex portion and the first color filter, the ratio of a length of a portion where the convex portion and the sealing layer are in contact with each other may be equal to or more than 20% based on a length of a portion where the first color filter and the sealing layer are in contact with each other.

According to this aspect, since the ratio of the length of the cross-section of the convex portion to the cross-sectional length of the first color filter is set to 20% or more, the bonding strength between the first color filter and the convex portion may be increased as compared with the case where the ratio is less than 20%. Therefore, the possibility that the first color filter peels off from the sealing layer may be reduced.

In the electro-optical device described above, a thickness of the convex portion may be equal to or less than a thickness of the color filter layer.

According to this aspect, since the thickness of the color filter layer is set to be thicker than the thickness of the convex portion, the electro-optical device displays accurate colors as compared with the case where the thickness of the color filter layer is equal to or less than the thickness of convex portion.

In the electro-optical device described above, the convex portion may include a translucent photosensitive resin material and the color filter layer may include a coloring material and the photosensitive resin material.

According to this aspect, since the color filter layer and the convex portion are formed of the same material, the bonding strength between the color filter layer and the convex portion may be increased as compared with the case where the color filter layer and the convex portion are formed of different materials. Therefore, the possibility that the color filter layer peels off from the sealing layer may be reduced.

According to another aspect of the invention, there is provided a method for manufacturing the electro-optical device including forming a convex portion on a sealing layer that covers the light-emitting element so as to include a first surface being in contact with the sealing layer and a second surface being a curved surface that is not in contact with the sealing layer, and forming a color filter layer on the sealing layer and the second surface.

According to the aspect of the invention, the color filter layer is provided so as to be in contact with the sealing layer and a second surface of the convex portion in contact with the sealing layer. Therefore, the possibility that the color filter layer peels off from the sealing layer may be reduced as compared with a case where the color filter layer is provided so as to be in contact with only the sealing layer.

Furthermore, according to the aspect of the invention, the second surface of the convex portion is formed in a curved surface shape. Thus, the adhesion between the color filter layer and the convex portion may be enhanced, and it is possible to reduce the possibility of peeling-off of the color filter layer from the sealing layer as compared with the case where the second surface of the convex portion is formed to have an angular portion.

Furthermore, in addition to the electro-optical device, the invention may be conceived as an electronic apparatus equipped with the electro-optical device. Typical examples of the electronic apparatus are display devices such as a head-mounted display (HMD) and an electronic viewfinder.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments for carrying out the invention will be described with reference to the drawings. However, in each view, the dimensions and the scale of each unit are appropriately different from the actual ones. In addition, since the embodiments described below are preferred specific examples of the invention, various technically preferable limitations are given, but in the following description, the scope of the invention is not limited to these forms unless otherwise stated to limit the invention.

A. EMBODIMENT

Hereinafter, an electro-optical device 1 according to the present embodiment will be described.

1. Outline of Electro-Optical Device

Figure 1:
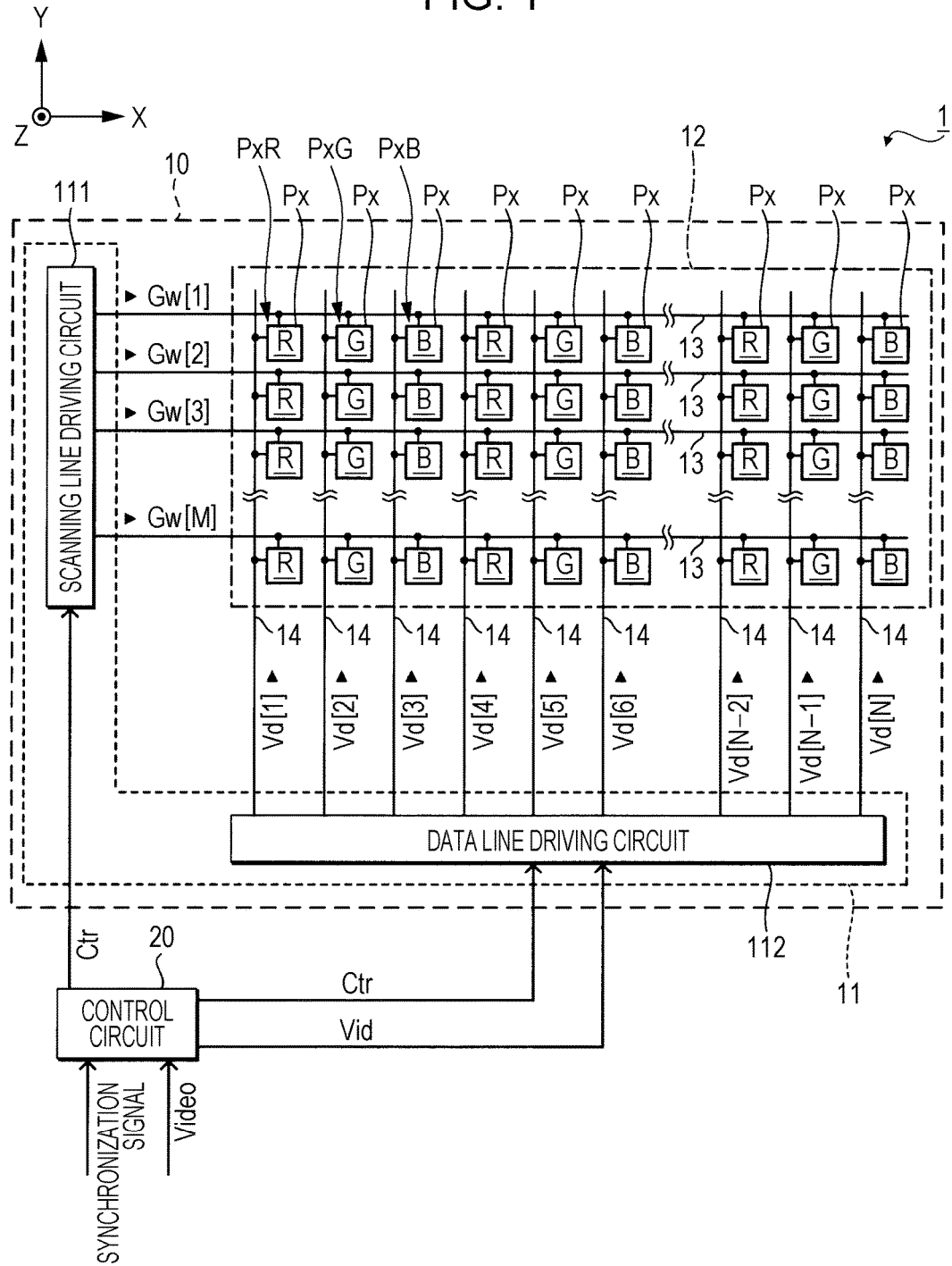
FIG. 1 is a block view showing an example of a configuration of an electro-optical device according to an embodiment of the invention.

FIG. 1 is a block view showing an example of a configuration of the electro-optical device 1 according to the embodiment.

As shown in FIG. 1, the electro-optical device 1 includes a display panel 10 having a plurality of pixels Px and a control circuit 20 controlling the operation of the display panel 10.

Digital image data Video is supplied to the control circuit 20 from a host circuit (not shown) synchronously with the synchronization signal. Here, the image data Video is digital data that defines a gradation level to be displayed by each pixel Px of the display panel 10. In addition, the synchronization signal is a signal including a vertical synchronization signal, a horizontal synchronization signal, a dot clock signal, and the like.

The control circuit 20 generates a control signal Ctr for controlling the operation of the display panel 10 based on the synchronization signal and supplies the generated control signal Ctr to the display panel 10. In addition, the control circuit 20 generates an analog image signal Vid based on the image data Video and supplies the generated image signal Vid to the display panel 10. Here, the image signal Vid is a signal that defines the luminance of the light-emitting element of the pixel Px so that each pixel Px displays the gradation specified by the image data Video.

As shown in FIG. 1, the display panel 10 includes M scanning lines 13 extending in an X direction and N data lines 14 extending in a Y direction, a display unit 12 having M×N pixels Px arranged in a matrix of M rows×N columns corresponding to the intersections of the scanning line 13 of M rows and the data line 14 of N columns, and a driving circuit 11 that drives the display unit 12 (M is a natural number of 1 or more. N is a natural number of 3 or more).

Hereinafter, in order to distinguish the plurality of pixels Px, a plurality of scanning lines 13, and a plurality of data lines 14 from each other, from a +Y direction to a −Y direction (Hereinafter, the +Y direction and the −Y direction are collectively referred to as a "Y-axis direction"), the rows are referred to as a first row, a second row, . . . , an M-th, and from a −X direction to a +X direction (Hereinafter, the +X direction and the −X direction are collectively referred to as an "X-axis direction"), the columns are referred to as a first column, a second column, ..., an N-th column.

The plurality of pixels Px provided on the display unit 12 include a pixel PxR capable of displaying red (R), a pixel PxG capable of displaying green (G), and a pixel PxB capable of displaying blue (B). Then, in the embodiment, a case where k is a variable representing a natural number of a multiple of 3 that satisfies 3≤k≤N, the pixel PxR is arranged in a (k−2)th column among the first column to the N-th column, the pixel PxG is arranged in the (k−1)th column, and the pixel PxB is arranged in the k-th column is assumed as an example.

As shown in FIG. 1, the driving circuit 11 includes a scanning line driving circuit 111 and a data line driving circuit 112.

The scanning line driving circuit 111 sequentially scans (selects) the scanning lines 13 of the first row to the M-th row. Specifically, the scanning line driving circuit 111 sequentially selects the scanning lines 13 for each horizontal scanning period in units of one frame by setting scanning signals Gw[1] to Gw[M] to be output to the respective scanning lines 13 of the first row to the M-th row to a predetermined selection potential sequentially in each horizontal scanning period. In other words, the scanning line driving circuit 111 selects the scanning line 13 of the m-th row in the m-th horizontal scanning period of one frame period by setting the scanning signal Gw[m] to be output to the scanning line 13 of the m-th row to the predetermined selection potential (m is a natural number satisfying 1≤m≤M). The period of one frame is a period during which the electro-optical device 1 displays one image.

Based on the image signal Vid and the control signal Ctr supplied from the control circuit 20, the data line driving circuit 112 generates analog data signals Vd[1] to Vd[N] that define the gradation to be displayed by each pixel P and outputs the generated data signals Vd[1] to Vd[N] to the N data lines 14 for each horizontal scanning period. In other words, in each horizontal scanning period, the data line driving circuit 112 outputs a data signal Vd[n] (n is a natural number satisfying 1≤n≤N) to the data line 14 of the n-th column.

In the embodiment, the image signal Vid output from the control circuit 20 is an analog signal, but the image signal Vid output from the control circuit 20 may be a digital signal. In this case, the data line driving circuit 112 converts the image signal Vid to generate analog data signals Vd[1] to Vd[N].

Figure 2:
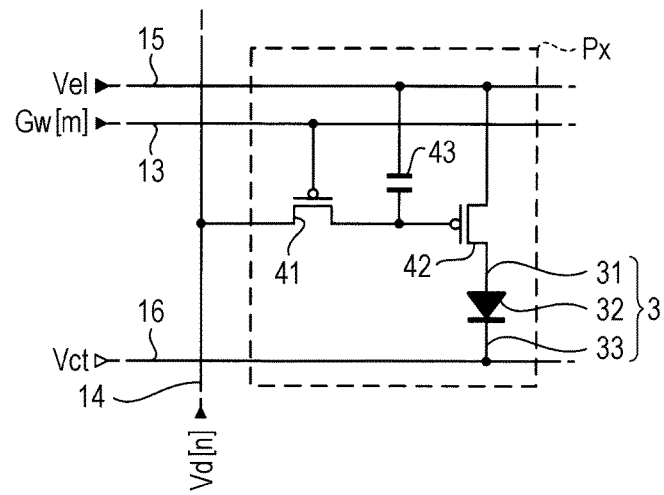
FIG. 2 is an equivalent circuit view showing an example of a configuration of a pixel.

FIG. 2 is an equivalent circuit view showing an example of a configuration of a pixel circuit 100 provided corresponding to each pixel Px in a one-to-one correspondence. In the embodiment, it is assumed that a plurality of pixel circuits 100 corresponding to the plurality of pixels Px are electrically identical to each other. In FIG. 2, the pixel circuit 100 provided corresponding to the pixel Px in the m-th row and the n-th column will be described by way of example.

The pixel circuit 100 includes a light-emitting element 3 included in the pixel Px corresponding to the pixel circuit 100, a P-channel MOS type transistors 41 and 42, and a storage capacitor 43. One or both of the transistors 41 and 42 may be N-channel MOS type transistors. In addition, the transistors 41 and 42 may be thin film transistors or field effect transistors.

The light-emitting element 3 includes a pixel electrode 31, a light-emitting function layer 32, and a counter electrode 33. The pixel electrode 31 functions as an anode for supplying holes to the light-emitting function layer 32. The counter electrode 33 is electrically connected to a feeder line 16 set at a potential Vct which is a power source potential on the low potential side of the pixel circuit 100 and functions as a cathode for supplying electrons to the light-emitting function layer 32. Then, the holes supplied from the pixel electrode 31 and the electrons supplied from the counter electrode 33 are coupled to the light-emitting function layer 32, and the light-emitting function layer 32 emits white light.

As will be described later in detail, a red color filter 8R is superimposed on the light-emitting element 3 (hereinafter, referred to as a light-emitting element 3R) of the pixel PxR, In t of the pixel PxG, a green color filter 8G is superimposed on the light-emitting element 3 (hereinafter, referred to as a light-emitting element 3G), and a blue color filter 8B is superimposed on a light-emitting element 3 (hereinafter, referred to as a light-emitting element 3B) included in the pixel PxB. Therefore, full-color display is enabled by the pixel PxR, the pixel PxG, and the pixel PxB.

The gate of the transistor 41 is electrically connected to the scanning line 13 of the m-th row, one of the source and the drain is electrically connected to the data line 14 of the n-th column, and the other of the source and the drain is electrically connected to the gate of the transistor 42 and one of the two electrodes included in the storage capacitor 43.

The gate of the transistor 42 is electrically connected to the other of the source or the drain of the transistor 41 and one electrode of the storage capacitor 43, one of the source and the drain is electrically connected to a feeder line 15 set to a potential Vel which is a power source potential on the high potential side of the pixel circuit 100, and the other of the source and the drain is electrically connected to the pixel electrode 31.

In the storage capacitor 43, one of the two electrodes included in the storage capacitor 43 is electrically connected to the other of the source and the drain of the transistor 41 and the gate of the transistor 42, and the other electrode of the two electrodes of the storage capacitor 43 is electrically connected to the feeder line 15. The storage capacitor 43 functions as a storage capacitor for holding the potential of the gate of the transistor 42.

When the scanning line driving circuit 111 sets the scanning signal Gw[m] to a predetermined selection potential and selects the scanning line 13 of the m-th row, the transistor 41 provided in the pixel Px of the m-th row and the n-th column is turned on. Then, when the transistor 41 is turned on, the data signal Vd[n] is supplied from the data line 14 of the n-th column to the gate of the transistor 42. In this case, the transistor 42 supplies a current corresponding to the potential (to be precise, a potential difference between the gate and the source) of the data signal Vd[n] supplied to the gate to the light-emitting element 3. Then, the light-emitting element 3 emits light with luminance corresponding to the magnitude of the current supplied from the transistor 42, that is, luminance corresponding to the potential of the data signal Vd[n].

Thereafter, in a case where the scanning line driving circuit 111 releases the selection of the scanning line 13 of the m-th row and the transistor 41 is turned off, the potential of the gate of the transistor 42 is held by the storage capacitor 43. Therefore, even after the transistor 41 is turned off, the light-emitting element 3 may emit light with luminance corresponding to the data signal Vd[n].

2. Configuration of Display Unit

Hereinafter, the configuration of the display unit 12 according to the embodiment will be described with reference to FIGS. 3 to 5.

Figure 3:
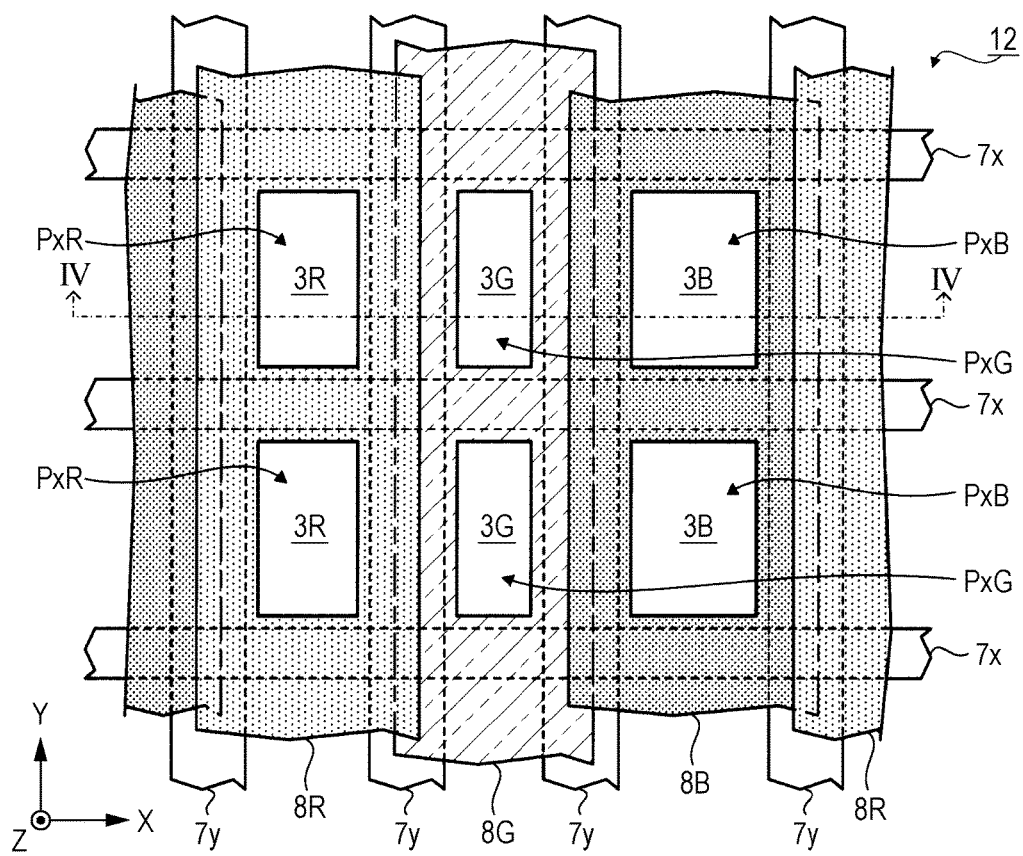
FIG. 3 is a plan view showing an example of a configuration of a display unit.

FIG. 3 is a plan view showing an example of a schematic structure of the display unit 12 according to the embodiment.

Specifically, FIG. 3 shows a case where a part of the display unit 12 is viewed in a plan view from a +Z direction (hereinafter, a +Z direction and a −Z direction are collectively referred to as a "Z-axis direction"), which is a direction in which the electro-optical device 1 emits light. The Z axis direction is a direction crossing the X-axis direction and the Y-axis direction.

As shown in FIG. 3, In addition, on the M light-emitting elements 3R (+Z direction) included in the M pixels PxR arranged in the Y axis direction in the (k−2)th column of the display unit 12, the red color filter 8R is disposed so as to cover the M light-emitting elements 3R. On the M light-emitting elements 3G (+Z direction) included in the M pixels PxG arranged in the Y axis direction in the (k−1)th column of the display unit 12, the green color filter 8G is disposed so as to cover the M light-emitting elements 3G. On the M light-emitting elements 3B (+Z direction) included in the M pixels PxB arranged in the Y axis direction in the k-th column of the display unit 12, the blue color filter 8B is disposed so as to cover the M light-emitting elements 3B.

In addition, a plurality of the convex patterns 7y extending in the Y-axis direction are provided between the two light-emitting elements 3 adjacent to each other in the X-axis direction on the display unit 12, and a plurality of the convex patterns 7x extending in the X-axis direction are provided between the two light-emitting elements 3 adjacent to each other in the Y-axis direction. More specifically, in the display unit 12 according to the embodiment, (N−1) columns of convex patterns 7y are provided so as to distinguish the N columns of pixels Px from the first column to the Nth column, and (M−1) rows of convex pattern 7x are provided so as to distinguish the M rows of pixels Px from the first row to the M-th row. However, the invention is not limited to such an embodiment, the convex patterns 7y may be provided on one or both of the −X side than the first row and the +X side than the N-th column, and the convex patterns 7x may be provided on one or both of the +Y side than the first row and the −Y side than the M-th row.

In this embodiment, the convex pattern 7y is an example of a "convex portion". However, the invention is not limited to such an aspect, and the convex pattern 7x may be an example of a "convex portion". Hereinafter, the convex pattern 7x and the convex pattern 7y may be collectively referred to as a convex pattern 7 in some cases.

Figure 4:
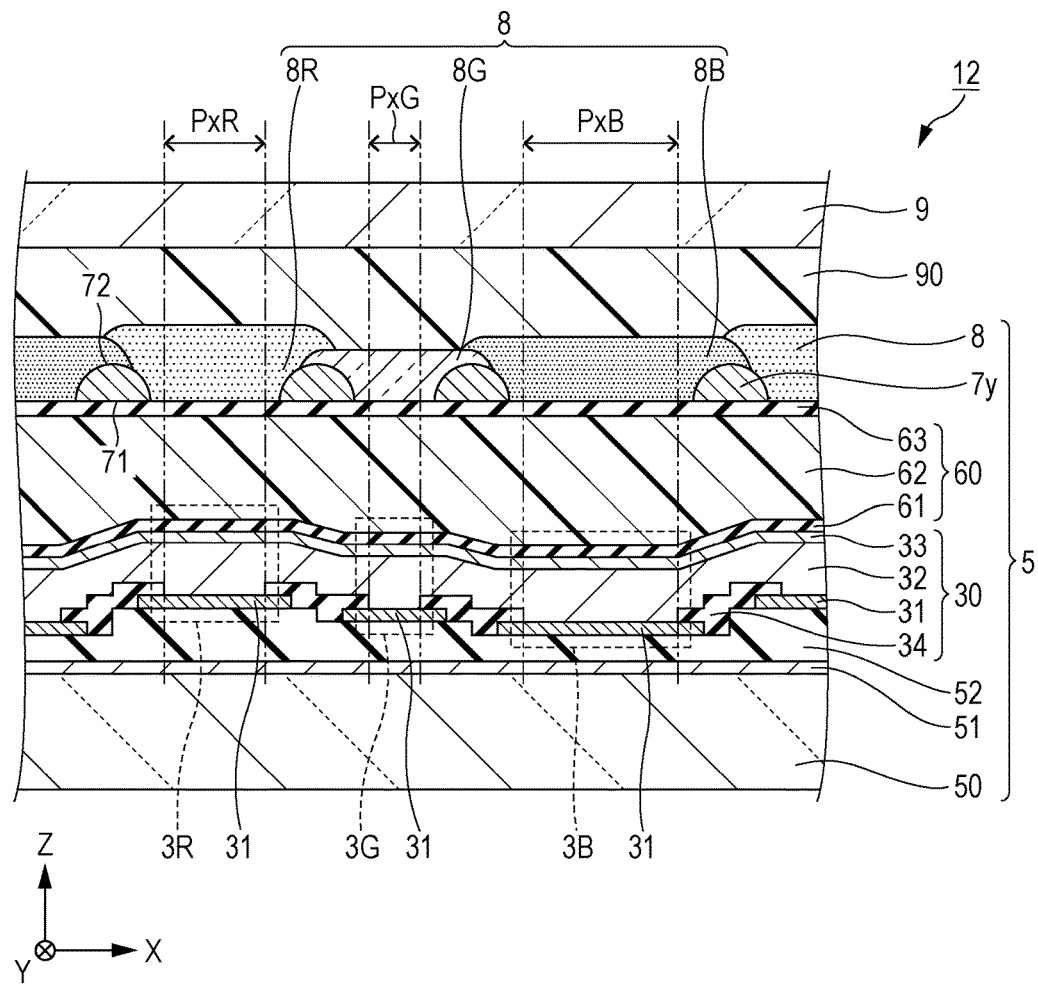
FIG. 4 is a partial cross-sectional view showing an example of the configuration of the display unit.

FIG. 4 is an example of a partial cross-sectional view taken along a line IV-IV in FIG. 3 of the display unit 12, in which a cross section of the pixel PxR, a cross section of the pixel PxG, and a cross section of the pixel PxB are included.

As shown in FIG. 4, the display unit 12 includes an element substrate 5, a counter substrate 9, and an adhesive layer 90 provided between the element substrate 5 and the counter substrate 9. In the embodiment, it is assumed that the electro-optical device 1 is a top emission type in which light is emitted from the counter substrate 9 side (+Z side).

The adhesive layer 90 is a transparent resin layer for bonding the element substrate 5 and the counter substrate 9. The adhesive layer 90 is formed using a transparent resin material such as an epoxy resin or an acrylic resin, for example.

The counter substrate 9 is a transparent substrate disposed on the +Z side of the adhesive layer 90. As the counter substrate 9, for example, a quartz substrate, a glass substrate or the like may be adopted.

The element substrate 5 includes a substrate 50, a reflective layer 51, a distance adjusting layer 52, a light-emitting layer 30, a sealing layer 60, a convex pattern 7, and a color filter layer 8 stacked on the substrate 50. Although details will be described later, the light-emitting layer 30 includes the light-emitting element 3 described above. The light-emitting element 3 emits light in the +Z direction and the −Z direction. In addition, the color filter layer 8 includes the color filter 8R, the color filter 8G, and the color filter 8B described above.

The substrate 50 is a substrate on which various wirings such as the scanning line 13 and the data line 14, and various circuits such as the driving circuit 11 and the pixel circuit 100 are mounted. The substrate 50 may be any substrate as long as various wirings and various circuits may be mounted. As the substrate 50, for example, a silicon substrate, a quartz substrate, a glass substrate, or the like may be adopted. On the +Z side of the substrate 50, a reflective layer 51 is stacked.

The reflective layer 51 is a constituent element for reflecting the light emitted from the light-emitting element 3 of the light-emitting layer 30 to the +Z direction side. The reflective layer 51 is formed using a material with high reflectance, for example, aluminum, silver or the like. On the +Z side of the reflective layer 51, the distance adjusting layer 52 is stacked.

The distance adjusting layer 52 is an insulating transparent layer for adjusting the optical distance between the light-emitting element 3 and the reflective layer 51 of the light-emitting layer 30. The distance adjusting layer 52 is formed using an insulating transparent material, for example, silicon oxide (SiOx) or the like. On the +Z side of the distance adjusting layer 52, the light-emitting layer 30 is laminated.

The light-emitting layer 30 includes the pixel electrode 31 stacked on the distance adjusting layer 52, an insulating film 34 stacked on the distance adjusting layer 52 and the pixel electrode 31, the light-emitting function layer 32 stacked so as to cover the pixel electrode 31 and the insulating film 34, and the counter electrode 33 stacked on the light-emitting function layer 32.

The pixel electrode 31 is a transparent layer having conductivity formed in an island shape individually for each pixel Px. The pixel electrode 31 is formed using a conductive transparent material, for example, ITO Indium Tin Oxide (ITO), Indium Zinc Oxide (IZO), or the like.

The insulating film 34 is an insulating constituent element arranged so as to cover the peripheral portion of each pixel electrode 31. The insulating film 34 is formed using an insulating material, for example, silicon oxide or the like.

The counter electrode 33 is a conductive constituent element having optical transparency and light reflectivity disposed so as to straddle the plurality of pixels Px. The counter electrode 33 is formed using, for example, an alloy of Mg and Ag or the like.

The light-emitting function layer 32 includes a hole injecting layer, a hole transporting layer, an organic light-emitting layer, and an electron transporting layer and is disposed so as to extend over a plurality of pixels Px. As described above, in the light-emitting function layer 32, holes are supplied from a portion of the pixel electrode 31 that is not covered with the insulating film 34 and emits white light. That is, in the plan view, the portion of the light-emitting layer 30 where the pixel electrode 31 is not covered with the insulating film 34 corresponds to the light-emitting element 3. In addition, in the embodiment, in the plan view, the portion where the light-emitting element 3 is provided is regarded as the pixel Px. In other words, in the plan view, the insulating film 34 is disposed so as to partition the plurality of pixels Px of the display unit 12 from each other. The white light emitted from the light-emitting element 3 is light including red light, green light, and blue light.

In the embodiment, the film thickness of the distance adjusting layer 52 is adjusted so that an optical resonance structure is formed by the reflective layer 51 and the counter electrode 33. Then, the light emitted from the light-emitting function layer 32 is repeatedly reflected between the reflective layer 51 and the counter electrode 33 to amplify the intensity of light having a wavelength corresponding to the optical distance between the reflective layer 51 and the counter electrode 33, and the amplified light is emitted to the +Z side to the counter substrate 9 via the counter electrode 33.

In the embodiment, as an example, the film thickness of the distance adjusting layer 52 is adjusted for each pixel Px so that the light having a wavelength of 610 nm is amplified in the pixel PxR, the light having a wavelength of 540 nm is amplified in the pixel PxG, and the light having a wavelength of 470 nm is amplified in the pixel PxB. For this reason, in the embodiment, red light with the maximum luminance of light having the wavelength of 610 nm is emitted from the pixel PxR, green light with the maximum luminance of light having the wavelength of 540 nm is emitted from the pixel PxG, and blue light with the maximum luminance of the light having the wavelength of 470 nm is emitted from the pixel PxB.

The sealing layer 60 includes a lower sealing layer 61 stacked on the counter electrode 33, a planarizing layer 62 stacked on the lower sealing layer 61, and an upper sealing layer 63 stacked on the planarizing layer 62.

The lower sealing layer 61 and the upper sealing layer 63 are transparent layers having insulating properties and disposed so as to extend over the plurality of pixels Px. The lower sealing layer 61 and the upper sealing layer 63 are constituent elements for inhibiting entry of moisture, oxygen, or the like into the light-emitting layer 30 and are formed using an inorganic material such as silicon oxide (SiOx), silicon nitride (SiNx), or aluminum oxide (AlxOy), for example.

The planarizing layer 62 is a transparent layer disposed so as to straddle the plurality of pixels Px and is a constituent element for providing a flat upper surface (a surface on the +Z side). The planarizing layer 62 is formed using, for example, a resin material such as an epoxy resin, an acrylic resin, a urethane resin, a silicon resin, or an inorganic material such as silicon oxide.

The convex pattern 7 is a transparent constituent element formed on the sealing layer 60 and includes a flat bottom surface 71 (an example of a "first surface") in contact with the sealing layer 60 and a curved upper surface 72 (an example of a "second surface") in contact with the color filter layer 8. The convex pattern 7 is formed using a transparent photosensitive resin material not containing a coloring material, for example, an acrylic resin. Although details will be described later, in the present embodiment, the photosensitive resin material used as the material of the convex pattern 7 is the same material as the main material of the color filter layer 8.

In the embodiment, the bottom surface 71 of the convex pattern 7 is a flat surface. The upper surface 72 of the convex pattern 7 is a curved surface. Specifically, in the cross section shown in FIG. 4, the shape indicated by the upper surface 72 is a curve, for example, a substantially circular arc shape.

The color filter layer 8 includes the color filter 8R, the color filter 8G, and the color filter 8B.

As shown in FIG. 4, the color filter 8R is formed on the upper sealing layer 63, the convex pattern 7, and the color filter 8G, and the color filter 8R so as to cover the light-emitting element 3R in a plan view on the +Z side of the light-emitting element 3R. In addition, the color filter 8G is formed on the upper sealing layer 63 and the convex pattern 7 so as to cover the light-emitting element 3G in a plan view on the +Z side of the light-emitting element 3G. In addition, the color filter 8B is formed on the upper sealing layer 63, the convex pattern 7, and the color filter 8G so as to cover the light-emitting element 3B in a plan view on the +Z side of the light-emitting element 3B. That is, the color filter 8G and the color filter 8R are provided on the +Z side of the top portion of the convex pattern 7y between the pixel PxR and the pixel PxG, the color filter 8G and the color filter 8B are provided on the +Z side of the top portion of the convex pattern 7y between the pixel PxG and the pixel PxB, and the color filter 8B and the color filter 8R are provided on the +Z side of the top portion of the convex pattern 7y between the pixel PxB and the pixel PxR.

The color filter 8R is formed of a photosensitive resin material containing a red coloring material, the color filter 8G is formed of a photosensitive resin material containing a green coloring material, and the color filter 8B is formed of a photosensitive resin material containing a blue coloring material.

As shown in FIG. 4, the adhesive layer 90 is provided on the +Z side of the color filter layer 8 so as to cover the color filter layer 8, and the counter substrate 9 is provided on the +Z side of the adhesive layer 90.

Figure 5:
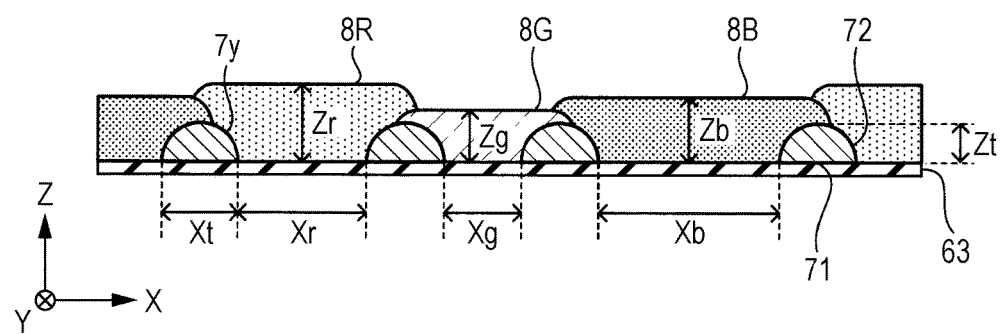
FIG. 5 is an explanatory view for explaining an example of the sizes of a convex pattern and a color filter layer.

FIG. 5 is an explanatory view for explaining the sizes (width and thickness) of the convex pattern 7 and the color filter layer 8.

FIG. 5 is a view in which the convex pattern 7, the color filter layer 8, and the upper sealing layer 63 are extracted from the partial cross-sectional view shown in FIG. 4.

In the present embodiment, as shown in FIG. 5, the convex pattern 7 and the color filter layer 8 are formed so that the relationship shown in the following expression (1) is established between the maximum value Zt of the thickness of the convex pattern 7 in the Z-axis direction, a maximum value Zr of the thickness of the color filter 8R in the Z-axis direction, a maximum value Zg of the thickness of the color filter 8G in the Z axis direction, and a maximum thickness Zb of the color filter 8B in the Z-axis direction.

$$Zt < Zg < Zb < Zr \tag{1}$$

More specifically, in the embodiment, as an example, the convex pattern 7 and the color filter layer 8 are formed so as to satisfy that the thickness Zt is 0.5 µm≤Zt<1.0 µm, the thickness Zr is 1.0 µm≤Zr≤1.5 µm, the thickness Zg is 0.5 µm<Zg≤1.2 µm, the thickness Zb is 0.8 µm≤Zb≤1.3 µm, and the relationship of the above equation (1). It is preferable that the convex pattern 7 and the color filter layer 8 be formed so that the thickness Zt of the convex pattern 7 is 30% or more of the maximum value of the thickness of the color filter layer 8 and 50% or more of the thickness Zg of the color filter 8G.

Furthermore, in the embodiment, as shown in FIG. 5, the convex pattern 7 and the color filter layer 8 are formed so that the relationship shown in the following expression (2) is established between a width Xt in the X-axis direction at a portion where the convex pattern 7 and the upper sealing layer 63 are in contact with each other, a width Xr in the X-axis direction at a portion where the color filter 8R and the upper sealing layer 63 are in contact with each other, a width Xg in the X-axis direction at a portion where the color filter 8G and the upper sealing layer 63 are in contact with each other, and a width Xb in the X-axis direction at a portion where the color filter 8B and the upper sealing layer 63 are in contact with each other.

$$Xt < Xg \leq Xr \leq Xb \quad (2)$$

More specifically, in the embodiment, as an example, the convex pattern 7 and the color filter layer 8 are formed so as to satisfy that the width Xt is 0.4 µm≤Xt≤1.0 µm, the width Xr is 1.5 µm≤Xr≤3.5 µm, the width Xg is 1.0 µm≤Xg≤3.0 µm, the width Xb is 2.0 µm≤Xb≤4.0 µm, and the relationship of the above equation (2). It is preferable that the convex pattern 7 and the color filter layer 8 be formed so that the width Xt of the convex pattern 7 is 20% or more of the width Xg of the color filter 8G.

3. Method for Manufacturing Electro-Optical Device

Hereinafter, an example of a method for manufacturing the electro-optical device 1 according to the embodiment will be described with reference to FIGS. 6 to 10.

Figure 6:
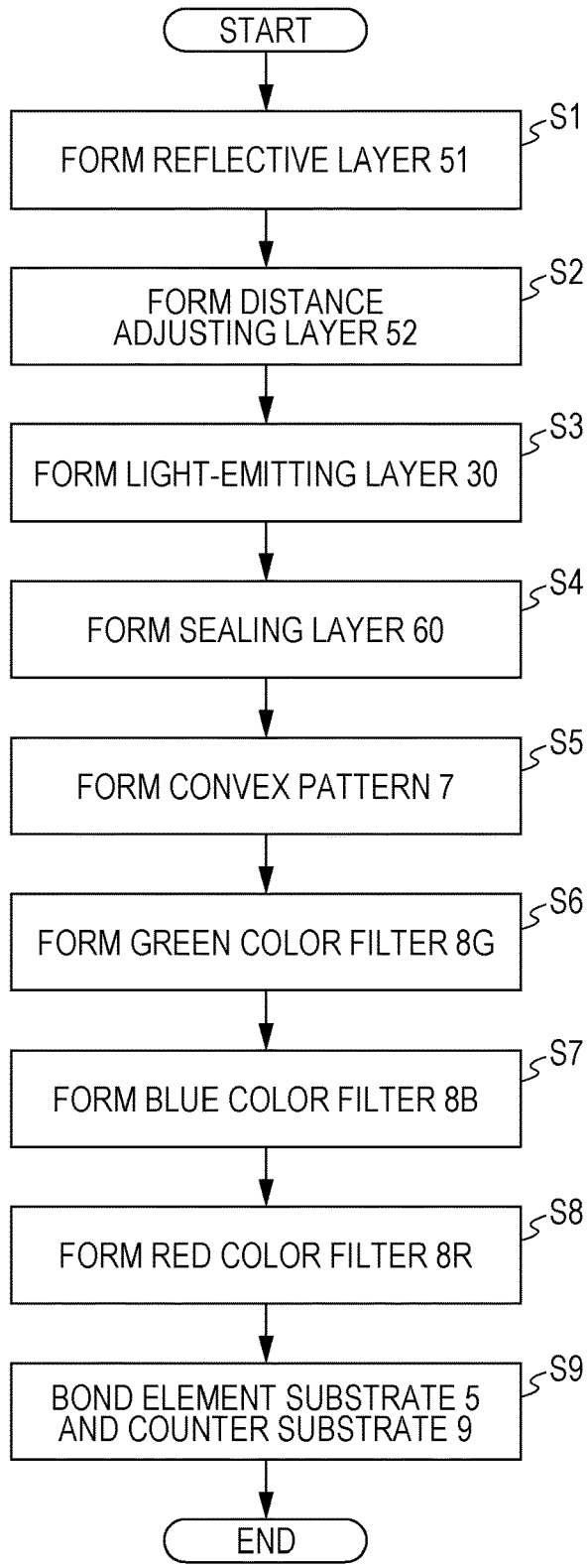
FIG. 6 is a flowchart showing an example of a manufacturing method for the electro-optical device.

FIG. 6 is a flowchart for explaining an example of a method for manufacturing the electro-optical device 1. As shown in FIG. 6, the method for manufacturing the electro-optical device 1 includes forming the reflective layer 51 on the substrate 50 (S1), forming the distance adjusting layer 52 on the reflective layer 51 (S2), forming the light-emitting layer 30 having the light-emitting element 3R, the light-emitting element 3G, and the light-emitting element 3B on the distance adjusting layer 52 (S3); forming the sealing layer 60 on the light-emitting layer 30 (S4), forming the convex pattern 7 on the upper sealing layer 63 of the sealing layer 60 (S5), forming the color filter 8G on the +Z side of the light-emitting element 3G having the pixel PxG on the upper sealing layer 63 and the convex pattern 7 (S6), forming the color filter 8B on the +Z side of the light-emitting element 3B having the pixel PxB on the upper sealing layer 63, the convex pattern 7, and on the color filter 8G (S7), forming the color filter 8R on the +Z side of the light-emitting element 3R having the pixel PxR on the upper sealing layer 63, the convex pattern 7, the color filter 8G, and the color filter 8B (S8), and forming the adhesive layer 90 on the color filter layer 8 and bonding the element substrate 5 and the counter substrate 9 with the adhesive layer 90 (S9).

An example of steps S5 to S8, which is a manufacturing process of the convex pattern 7 and the color filter layer 8 out of the above steps S1 to S9, will be described below.

Figure 7:
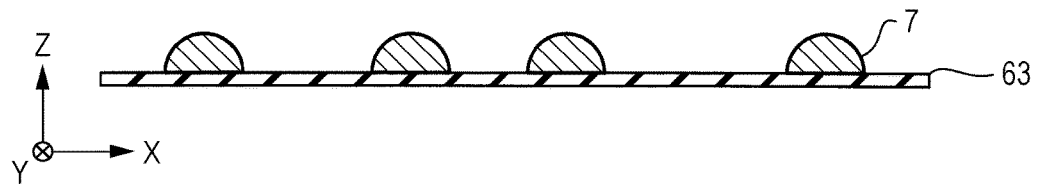
FIG. 7 is an explanatory view for explaining an example of the manufacturing method for the electro-optical device.

In step S5, first, a photosensitive resin material not containing a coloring material is applied onto the upper sealing layer 63 by a spin coating method and pre-baked, whereby a photosensitive resin is formed on the upper sealing layer 63. The photosensitive resin material may be a positive type or a negative type. Next, using a photolithography method, the photosensitive resin layer is exposed and developed to form the convex pattern 7 on the upper sealing layer 63, as shown in FIG. 7.

Figure 8:
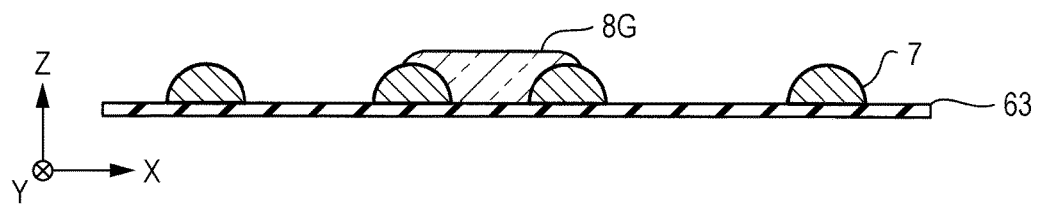
FIG. 8 is an explanatory view for explaining an example of the manufacturing method for the electro-optical device.

In step S6, first, a photosensitive resin material containing a green coloring material is applied onto the upper sealing layer 63 and the convex pattern 7 by the spin coating method and dried, whereby a green photosensitive resin layer is formed. Next, a portion of the green photosensitive resin layer forming the color filter 8G is irradiated with light and exposed, and a developing solution or the like is discharged to the photosensitive resin layer, whereby the unexposed photosensitive resin layer is removed. Thereafter, by burning and curing the green photosensitive resin layer, as shown in FIG. 8, the color filter 8G is formed on the upper sealing layer 63 and the convex pattern 7.

Figure 9:
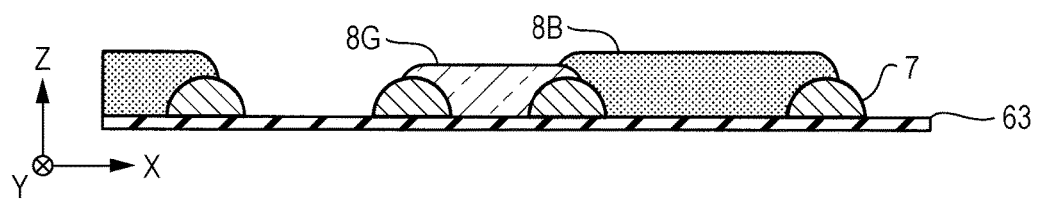
FIG. 9 is an explanatory view for explaining an example of the manufacturing method for the electro-optical device.

In the step S7, first, a photosensitive resin material containing a blue coloring material is applied onto the upper sealing layer 63, the convex pattern 7, and the color filter 8G by the spin coat method and dried, whereby a blue photosensitive resin layer is formed. Next, for example, a portion of the blue photosensitive resin layer forming the color filter 8B is irradiated with light and exposed, and a developing solution or the like is discharged to the photosensitive resin layer, whereby the unexposed photosensitive resin layer is removed. Thereafter, by burning and curing the blue photosensitive resin layer, as shown in FIG. 9 the color filter 8B is formed on the upper sealing layer 63, the convex pattern 7, and the color filter 8G.

Figure 10:
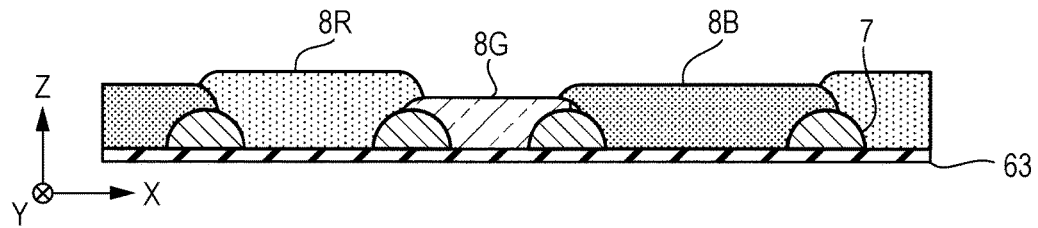
FIG. 10 is an explanatory view for explaining an example of the manufacturing method for the electro-optical device.

In the step S8, first, a photosensitive resin material containing a red coloring material is applied onto the upper sealing layer 63, the convex pattern 7, the color filter 8G, and the color filter 8B by the spin coat method and dried, whereby a red photosensitive resin layer is formed. Next, for example, a portion of the red photosensitive resin layer forming the color filter 8R is irradiated with light and exposed, and a developing solution or the like is discharged to the photosensitive resin layer, whereby the unexposed photosensitive resin layer is removed. Thereafter, by burning and curing the red photosensitive resin layer, as shown in FIG. 10, the color filter 8B is formed on the upper sealing layer 63, the convex pattern 7, the color filter 8G, the color filter 8B, and the color filter 8R.

4. Effect of Embodiment

As described above, in this embodiment, the convex pattern 7 is provided between the sealing layer 60 and the color filter layer 8. As described above, the convex pattern 7 is mainly formed of a photosensitive resin material not containing a coloring material. Generally, the bonding strength of a resin material not containing a coloring material is stronger than the bonding strength of a resin material containing a coloring material. Therefore, as in this embodiment, in a case where a constituent element (hereinafter, referred to as a "constituent on the sealing layer") formed on the sealing layer 60 includes the convex pattern 7 containing no coloring material in addition to the color filter layer 8 containing a coloring material, the bonding strength of the constituent on the sealing layer to the sealing layer 60 may be increased as compared with the case where the sealing layer 60 is formed only from the color filter layer 8 containing a coloring material. Therefore, according to this embodiment, in the manufacturing process of the electro-optical device 1 or the like, it is possible to reduce the possibility that the components on the sealing layer such as the color filter layer 8 peel off from the sealing layer 60.

In addition, in this embodiment, the convex pattern 7 and the color filter layer 8 are formed using the same photosensitive resin material as a main component. Then, generally, the bonding strength between the constituent elements having the same main constituent is stronger than the bonding strength between constituent elements having different main constituents. Therefore, the bonding strength between the color filter layer 8 and the convex pattern 7 is stronger than the bonding strength between the color filter layer 8 and the sealing layer 60. As described above, the bonding strength between the convex pattern 7 not containing the coloring material and the sealing layer 60 is stronger than the bonding strength between the color filter layer 8 containing the coloring material and the sealing layer 60. Therefore, as in this embodiment, since the constituent on the sealing layer has the convex pattern 7, it is possible to reduce the possibility that the color filter layer 8 peels off from the sealing layer 60.

Furthermore, in the embodiment, the convex pattern 7 is formed so that the upper surface 72 is a curved surface. Then, in a case where the upper surface 72 of the convex pattern 7 is a curved surface, the adhesiveness between the color filter layer 8 formed on the upper surface 72 and the convex pattern 7 is higher as compared with the case where the upper surface 72 of the convex pattern 7 has a shape having a corner like a polyhedron. Therefore, according to the embodiment, it is possible to strengthen the bonding strength of the convex pattern 7 and the color filter layer 8 as compared with the case where the upper surface 72 of the convex pattern 7 has a corner. In this way, it is possible to reduce the possibility that the color filter layer 8 peels off from the convex pattern 7 and the sealing layer 60.

In the embodiment, the color filter 8G is an example of a "first color filter", and the green light transmitted through the color filter 8G is an example of "the light in a first wavelength region". In addition, one of the color filter 8B and the color filter 8R is an example of a "second color filter", and one of the blue light transmitted through the color filter 8B and the red light transmitted through the color filter 8R is an example of "the light in a second wavelength region".

B. MODIFICATION EXAMPLE

Each of the above embodiments may be variously modified. Specific modification embodiments are exemplified below. Two or more embodiments arbitrarily selected from the following examples may be appropriately merged within a range not mutually contradictory. With respect to elements whose functions and functions are the same as those of the embodiment in the modification examples described below, the reference numerals referred to in the above description are used, and the detailed description thereof will be appropriately omitted.

Modification Example 1

In the above-described embodiment, the color filter 8G is exemplified as the first color filter and the color filter 8B or the color filter 8R is exemplified as the second color filter, but the invention is not limited to such an embodiment, the first color filter may be any one of the color filters 8R, 8G, and 8B, and the second color filter may be any one of the color filters 8R, 8G, and 8B. That is, the first color filter and the second color filter may be color filters that transmit light of different colors, or may be color filters that transmit light of the same color. For example, the first color filter may be the color filter 8G provided so as to cover the pixel Px of the m-th row and the n-th column, and the second color filter may be the color filter 8G provided so as to cover the pixel Px of the (m+1)th row and the n-th column.

Modification Example 2

In the embodiment and modification example described above, on the upper sealing layer 63, the convex pattern 7y extending in the Y-axis direction and the convex pattern 7x extending in the X-axis direction are formed as the convex pattern 7, but the invention is not limited to such an embodiment, and at least the convex pattern 7y may be formed as the convex pattern 7 on the upper sealing layer 63.

Figure 11:
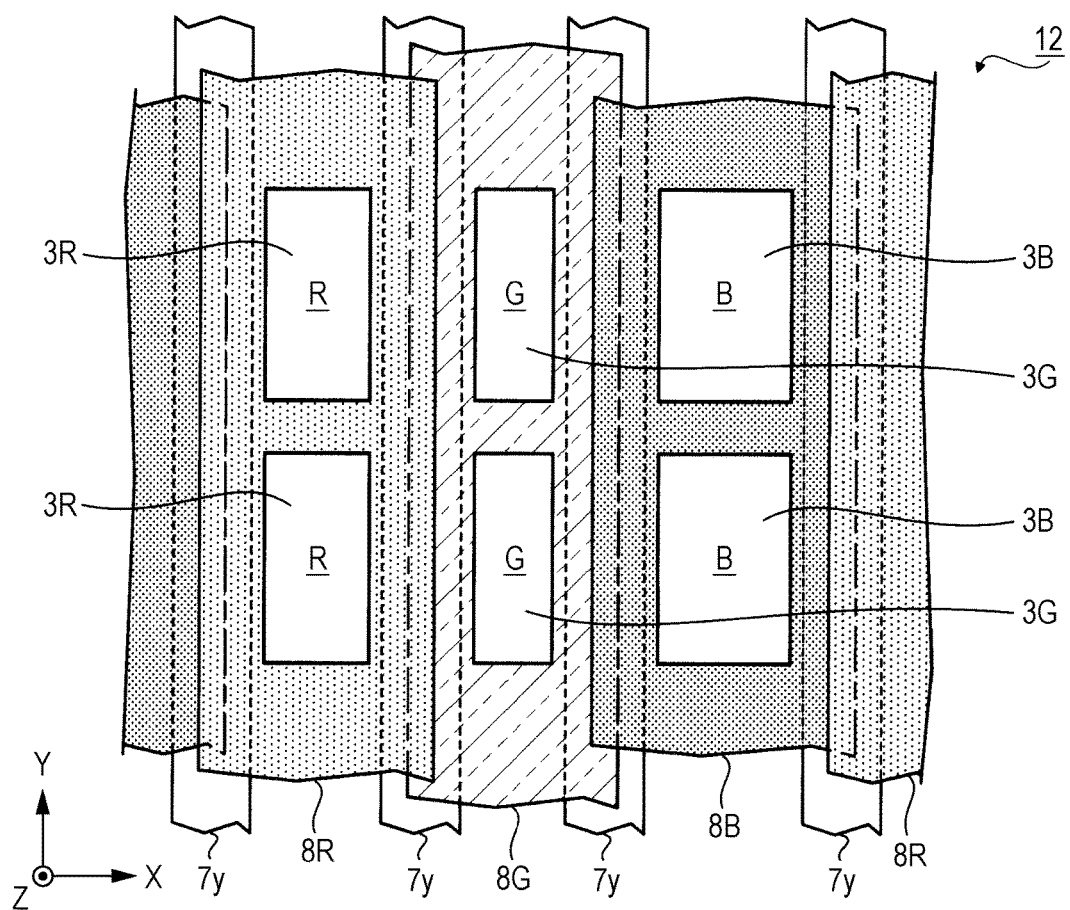
FIG. 11 is a plan view showing an example of a configuration of the electro-optical device according to a modification example 2.

FIG. 11 is a plan view showing an example of a schematic structure of the display unit 12 according to the present modification example. As shown in FIG. 11, between the upper sealing layer 63 and the adhesive layer 90 of the display unit 12 according to this modification example, when viewed in a plan view, a plurality of convex patterns 7y are provided so as to distinguish N light-emitting elements 3 aligned in the X axis direction from each other and extend each light-emitting element in the Y-axis direction, the color filter 8G is provided on the upper sealing layer 63 and the convex pattern 7y so as to cover the M light-emitting elements 3G arranged in the Y axis direction in the (k−1)th column, the color filter 8B is provided on the upper sealing layer 63, the convex pattern 7y, and the color filter 8G so as to cover M light-emitting elements 3B aligned in the Y axis direction in the k-th column, and the color filter 8R is provided on the upper sealing layer 63, the convex pattern 7y, the color filter 8G, and the color filter 8B so as to cover the M light-emitting elements 3R arranged in the Y axis direction in the (k−2)th column.

Modification Example 3

In the embodiment and modification example described above, after stacking the color filter 8G (S6), the color filter 8B is stacked (S7), and after stacking the color filter 8B (S7), the color filter 8R is stacked (S8), but the invention is not limited to such an embodiment, and the order of stacking the color filters 8R, 8G, and 8B is arbitrary.

Modification Example 4

In the embodiment and modification example described above, The thickness Zt of the convex pattern 7, the thickness Zr of the color filter 8R, the thickness Zg of the color filter 8G, and the thickness Zb of the color filter 8B satisfy the above equation (1), but the invention is not limited to such an embodiment, and at least the following equations (3), (4) and (5) may be satisfied.

$$Zt < Zg \tag{3}$$

$$Zt < Zb \tag{4}$$

$$Zt < Zr \tag{5}$$

In addition, in the embodiment and modification examples described above, the width Xt of the convex pattern 7, the width Xr of the color filter 8R, the width Xg of the color filter 8G, and the width Xb of the color filter 8B satisfy the above equation (2), but the invention is not limited to such an embodiment, and at least the following equations (6), (7) and (8) may be satisfied.

$$Xt \leq Xg \tag{6}$$

$$Xt \leq Xr \tag{7}$$

$$Xt \leq Xb \tag{8}$$

C. APPLICATION EXAMPLE

The electro-optical device 1 according to the embodiment and the modification example described above may be applied to various electronic apparatuses. Hereinafter, the electronic apparatus according to the invention will be described.

Figure 12:
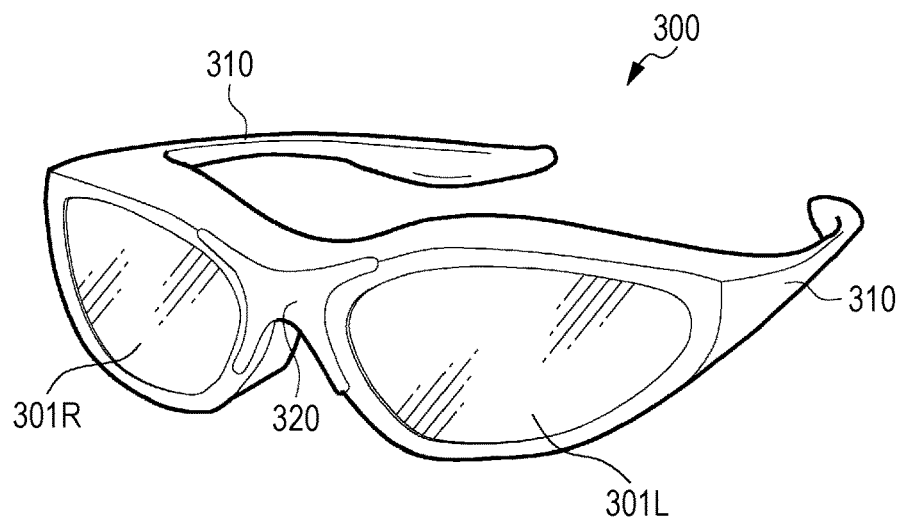
FIG. 12 is a perspective view of a head-mounted display according to the invention.

FIG. 12 is a perspective view showing an appearance of a head-mounted display 300 as an electronic apparatus employing the electro-optical device 1 of the aspect of the invention. As shown in FIG. 12, the head-mounted display 300 includes a temple 310, a bridge 320, a projection optical system 301L, and a projection optical system 301R. Then, in FIG. 12, the electro-optical device 1 (not shown) for the left eye is provided behind the projection optical system 301L, and the electro-optical device 1 (not shown) for the right eye is provided behind the projection optical system 301R.

Figure 13:
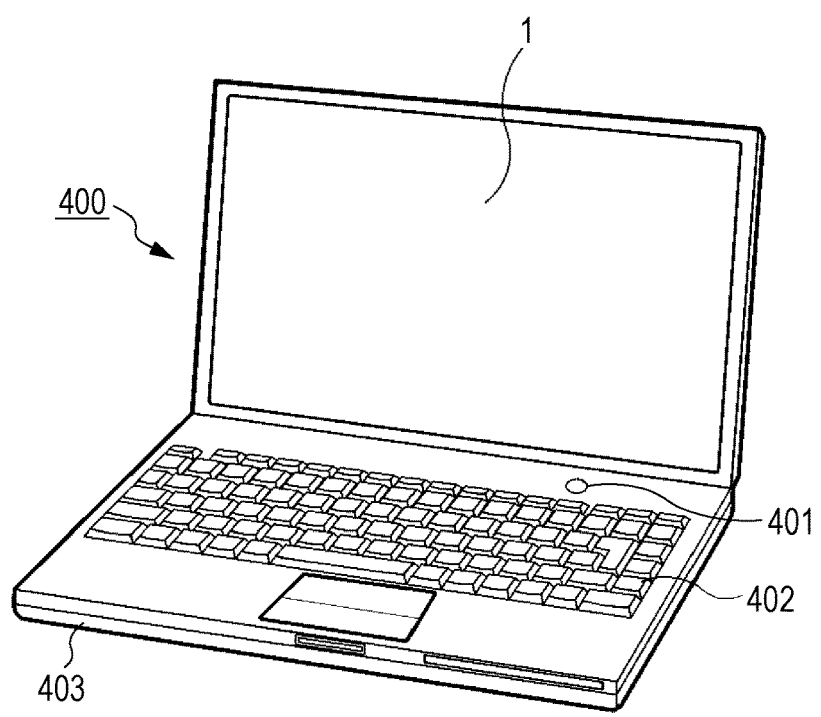
FIG. 13 is a perspective view of a personal computer according to the invention.

FIG. 13 is a perspective view of a portable personal computer 400 employing the electro-optical device 1. The personal computer 400 includes the electro-optical device 1 for displaying various images, and the main body unit 403 provided with a power switch 401 and a keyboard 402.

As an electronic apparatus to which the electro-optical device 1 according to the aspect of the invention is applied, in addition to the apparatuses exemplified in FIGS. 12 and 13, it is also possible to use a portable telephone, a smartphone, a personal digital assistant (PDA), a digital still camera, a television, a video camera, a car navigation device, an in-vehicle display device (instrument panel), an electronic notebook, an electronic paper, a calculator, a word processor, a workstation, a video phone, a POS terminal, and the like. Furthermore, the electro-optical device 1 according to the aspect of the invention may be applied as a display unit provided in an electronic apparatus such as a printer, a scanner, a copying machine, and a video player.

The entire disclosure of Japanese Patent Application No. 2016-222729, filed Nov. 15, 2016 is expressly incorporated by reference herein.

What is claimed is:

1. An electro-optical device comprising:
a light-emitting element;
a sealing layer that covers the light-emitting element;
a color filter layer that is formed on the sealing layer and partially contacts the sealing layer; and
a convex portion that is provided between the sealing layer and the color filter layer and has a first surface in contact with the sealing layer and a second surface in contact with the color filter layer, wherein the second surface is a curved surface.

2. The electro-optical device according to claim 1, wherein:
the second surface is a continuously curved surface whose top portion farthest from the sealing layer is covered with both a first color filter and a second color filter.

3. An electronic apparatus comprising:
the electro-optical device according to claim 1.

4. The electro-optical device according to claim 1, wherein
a shape of the second surface in a cross section including the color filter layer and the convex portion is a substantially arc shape.

5. An electronic apparatus comprising:
the electro-optical device according to claim 4.

6. The electro-optical device according to claim 1, wherein:
the color filter layer includes a first color filter that transmits light in a first wavelength region and a second color filter that transmits light in a second wavelength region; and
a top portion of the second surface farthest from the sealing layer is covered with the first color filter and the second color filter.

7. An electronic apparatus comprising:
the electro-optical device according to claim 6.

8. The electro-optical device according to claim 1, wherein:
the color filter layer includes a first color filter being in contact with the sealing layer and the convex portion; and
in a cross section including the convex portion and the first color filter, a length of the convex portion that is in contact with the sealing layer is equal to or more than 20% of a length of the first color filter that is in contact with the sealing layer.

9. An electronic apparatus comprising:
the electro-optical device according to claim 8.

10. The electro-optical device according to claim 1, wherein
a thickness of the convex portion is equal to or less than a thickness of the color filter layer.

11. An electronic apparatus comprising:
the electro-optical device according to claim 10.

12. The electro-optical device according to claim 1, wherein:
the convex portion includes a translucent photosensitive resin material; and
the color filter layer includes a coloring material and the photosensitive resin material.

13. An electronic apparatus comprising:
the electro-optical device according to claim 12.

14. A method for manufacturing an electro-optical device, comprising:
forming a convex portion on a sealing layer that covers a light-emitting element so as to include a first surface being in contact with the sealing layer and a second surface being a curved surface that is not in contact with the sealing layer; and
forming a color filter layer on the sealing layer and the second surface, the color filter layer partially contacting the sealing layer.

15. An electronic apparatus comprising:
the electro-optical device according to claim 14.

* * * * *